United States Patent
Wuu et al.

(10) Patent No.: US 8,680,554 B2
(45) Date of Patent: Mar. 25, 2014

(54) EPITAXIAL STRUCTURE AND METHOD FOR MAKING THE SAME

(75) Inventors: Dong-Sing Wuu, Taichung (TW); Ray-Hua Horng, Taichung (TW); Tsung-Yen Tsai, Taichung (TW)

(73) Assignee: National Chung-Hsing University, Taichung (TW)

( * ) Notice: Subject to any disclaimer, the term of this patent is extended or adjusted under 35 U.S.C. 154(b) by 43 days.

(21) Appl. No.: 13/331,530

(22) Filed: Dec. 20, 2011

(65) Prior Publication Data

US 2012/0168914 A1  Jul. 5, 2012

(30) Foreign Application Priority Data

Dec. 23, 2010  (TW) ................. 99145518 A

(51) Int. Cl.
*H01L 21/02* (2006.01)

(52) U.S. Cl.
USPC ............. 257/98; 257/E21.121; 257/E21.158; 257/E23.01; 257/E29.089; 257/E33.068

(58) Field of Classification Search
USPC ............ 257/98, 734, E21.121, 122, 158, 215, 257/599, E23.01, E29.089, 33.055, 68, 71
See application file for complete search history.

(56) References Cited

U.S. PATENT DOCUMENTS

| 6,420,242 B1* | 7/2002 | Cheung et al. ............ 438/458 |
| 2002/0137342 A1* | 9/2002 | Ishida et al. ............ 438/689 |
| 2008/0038857 A1 | 2/2008 | Kim et al. |
| 2010/0200880 A1* | 8/2010 | Sit et al. ............ 257/98 |
| 2010/0261300 A1* | 10/2010 | Tu et al. ............ 438/29 |
| 2011/0159624 A1* | 6/2011 | Chen et al. ............ 438/42 |
| 2011/0227213 A1* | 9/2011 | Wuu et al. ............ 257/734 |
| 2012/0077334 A1* | 3/2012 | Wuu et al. ............ 438/464 |
| 2012/0161149 A1* | 6/2012 | Wuu et al. ............ 257/76 |
| 2012/0241798 A1* | 9/2012 | David et al. ............ 257/98 |

FOREIGN PATENT DOCUMENTS

| KR | 10-2004-0036825 A | 5/2004 |
| KR | 10-2009-0114870 A | 11/2009 |

OTHER PUBLICATIONS

KR Laid-Open Patent No. 10-2011-0139884, Office Action.

* cited by examiner

*Primary Examiner* — Michael Lebentritt
(74) *Attorney, Agent, or Firm* — Foley & Lardner LLP

(57) ABSTRACT

A method for making an epitaxial structure includes: (a) providing a sacrificial layer on a temporary substrate, the sacrificial layer being made of gallium oxide; and (b) growing epitaxially an epitaxial layer unit over the sacrificial layer.

3 Claims, 6 Drawing Sheets

EPITAXIAL STRUCTURE AND METHOD FOR MAKING THE SAME

CROSS-REFERENCE TO RELATED APPLICATION

This application claims priority of Taiwanese application No. 099145518, filed on Dec. 23, 2010.

BACKGROUND OF THE INVENTION

1. Field of the Invention

This invention relates to an epitaxial structure and a method for making the same.

2. Description of the Related Art

A substrate, which is suitable for epitaxial growth of an epitaxial layer in an optoelectronic device, often has poor thermal or electric conductivity. Therefore, in consideration of the above problems and the epitaxial quality, the fabrication of the optoelectronic device usually includes a step of removing the epitaxial layer from a temporary substrate used for epitaxial growth of the epitaxial layer.

However, as disclosed by Ji-Hao Cheng, et al., in "Effects of laser source on damage mechanisms and reverse-bias leakages of laser lift-off GaN-based LEDs," *Journal of The Electrochemical Society*, 156 (8), H640-H643 (2009), when the temporary substrate is removed from the epitaxial layer using a laser lift-off process (i.e., the removing step), the quality and function of the epitaxial layer are adversely affected.

SUMMARY OF THE INVENTION

Therefore, an object of the present invention is to provide an epitaxial structure and a method for making the same that can overcome the aforesaid drawbacks associated with the prior art.

According to a first aspect of this invention, a method for making an epitaxial structure comprises:

(a) providing a sacrificial layer on a temporary substrate, the sacrificial layer being made of gallium oxide; and (b) growing epitaxially an epitaxial layer unit over the sacrificial layer.

According to a second aspect of this invention, an epitaxial structure comprise:

a temporary substrate;

a sacrificial layer formed on the temporary substrate, and made of gallium oxide; and an epitaxial layer unit epitaxially grown over an upper surface of the sacrificial layer opposite to the temporary substrate.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
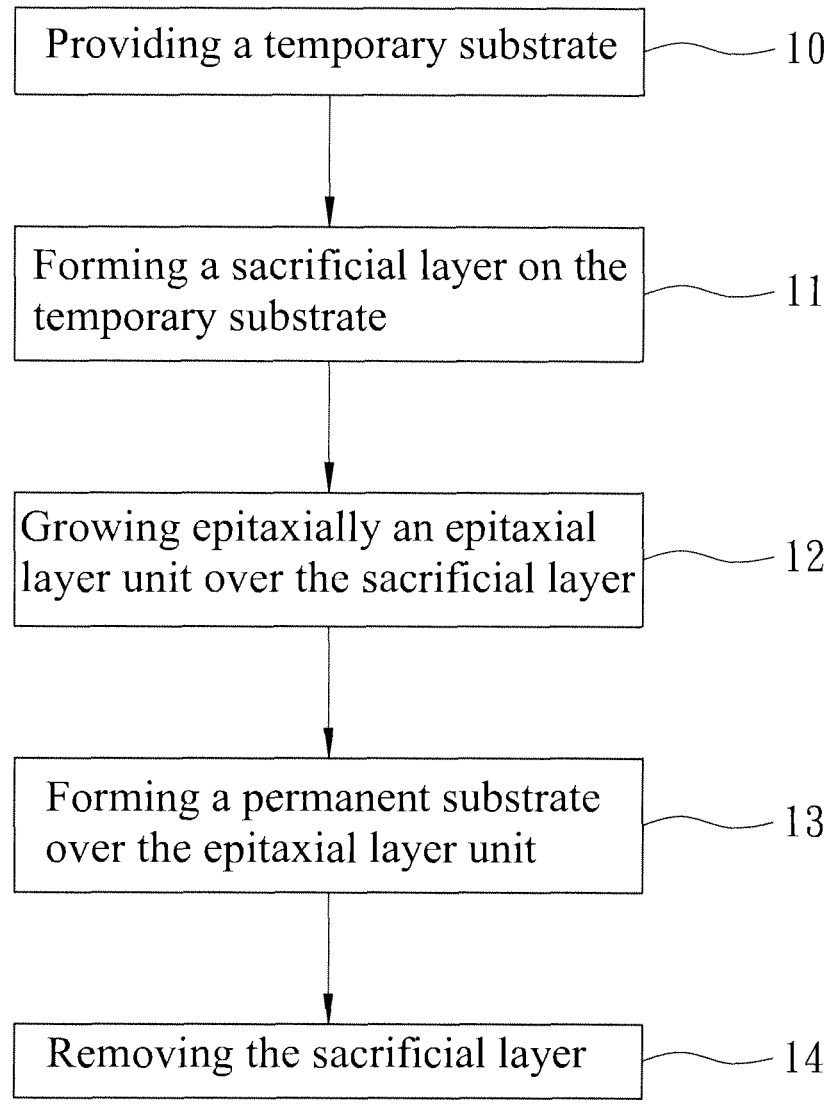
FIG. 1 is a flowchart illustrating the first preferred embodiment of a method for making an epitaxial structure according to the present invention.

Before the present invention is described in greater detail with reference to the accompanying preferred embodiments, it should be noted herein that like elements are denoted by the same reference numerals throughout the disclosure.

Referring to FIG. 1, the first preferred embodiment of a method for making an epitaxial structure according to this invention comprises the following steps.

Figure 2:
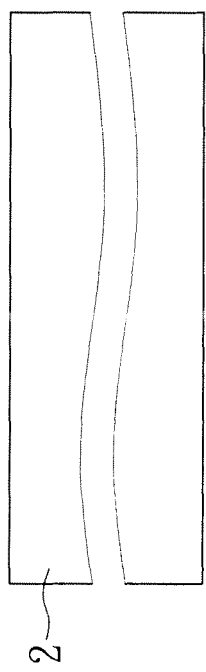

In step 10, a temporary substrate 2 is provided (see FIG. 2). The temporary substrate 2 is made of, for example, sapphire ($Al_2O_3$), silicon, silicon carbide, etc.

Figure 3:
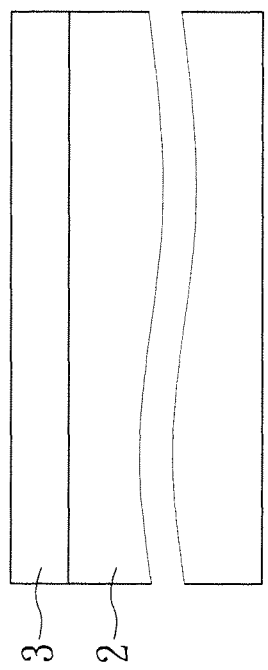
FIGS. 2 to 7 are schematic diagrams illustrating consecutive steps of the method illustrated in FIG. 1.

In step 11, a sacrificial layer 3, which is made of gallium oxide, is formed on the temporary substrate 2 (see FIG. 3). The temperature for forming the sacrificial layer 3 preferably ranges from 200° C. to 700° C., and is more preferably 400° C. The gallium oxide layers grown under these temperatures show various crystalline quality. The temperature for forming the gallium oxide, especially $Ga_2O_3$ is more preferably 400° C. because the sacrificial layer 3 can be easily removed.

The sacrificial layer 3 can be formed using metal organic chemical vapor deposition (MOCVD), pulsed laser deposition (PLD), etc. When using PLD, the pressure of a chamber for conducting PLD preferably ranges from 0.1 to $10^{-4}$ torr, and the forming rate of the sacrificial layer 3 preferably ranges from 0.1 to 1 micron/hour.

Figure 4:
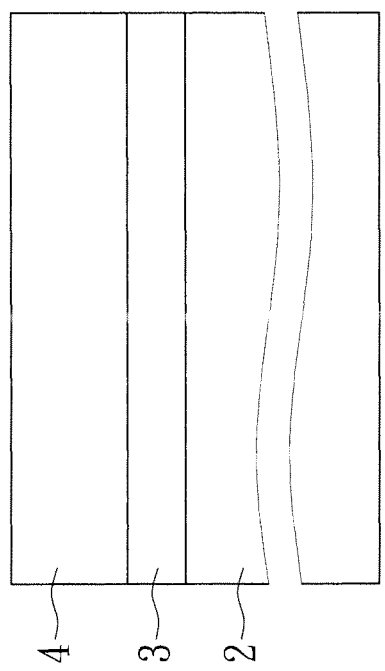

In step 12, an epitaxial layer unit 4 is grown epitaxially over the sacrificial layer 3 (FIG. 4). In the initial period, the epitaxial layer unit 4 is grown at a lower temperature (500~600° C.) in a nitrogen atmosphere. Hydrogen is not used in the initial period. Thereafter, the epitaxial layer unit 4 is grown at a higher temperature (700~1100° C.) in an atmosphere including nitrogen and hydrogen.

When the epitaxial layer unit 4 is formed at the lower temperature in the nitrogen atmosphere (without hydrogen), the gallium oxide of the sacrificial layer 3 can be protected and will not be decomposed into gallium-rich oxide or gallium during the epitaxial environment.

With increasing temperature and introducing hydrogen, the epitaxial layer unit 4 has improved epitaxial quality.

The epitaxial layer unit 4 is made of gallium nitride.

Figure 5:
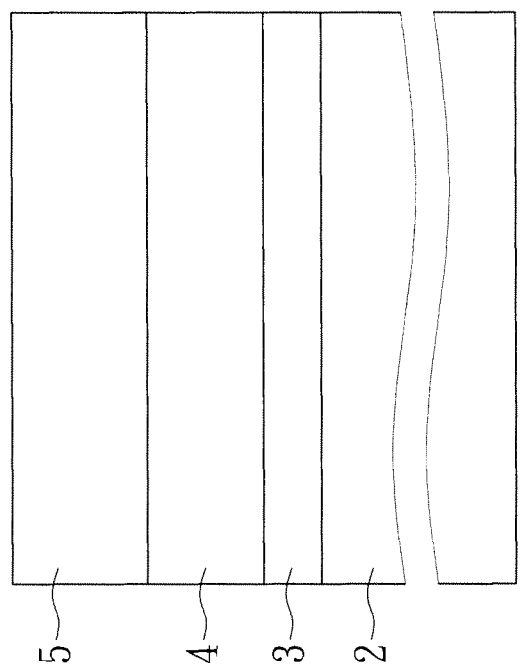

In step 13, a permanent substrate 5 is formed over the epitaxial layer unit 4 opposite to the sacrificial layer 3 (see FIG. 5). Based on actual requirements, the permanent substrate 5 may be made of copper, silicon, molybdenum, etc. Otherwise, the permanent substrate 5 may be a flexible circuit board.

Figure 7:
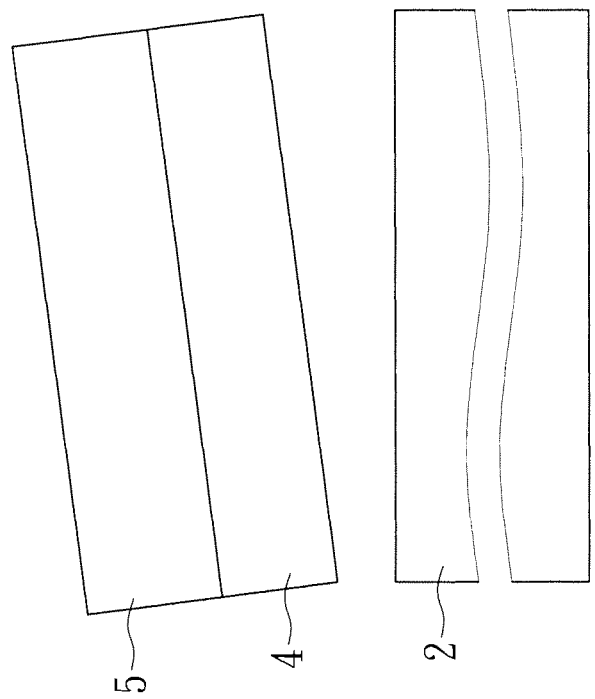
Figure 6:
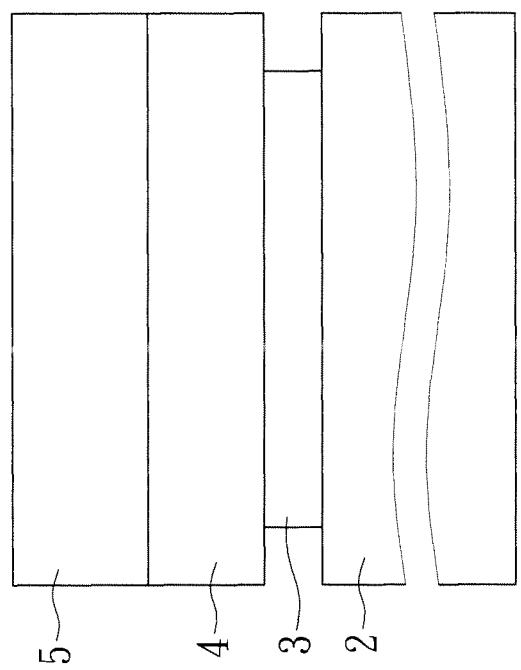

In step 14, an etchant is introduced to etch the sacrificial layer 3 and to remove the temporary substrate 2 and the sacrificial layer 3 from the epitaxial layer unit 4 (see FIGS. 6 and 7). In this embodiment, the etchant is HF.

Figure 8:
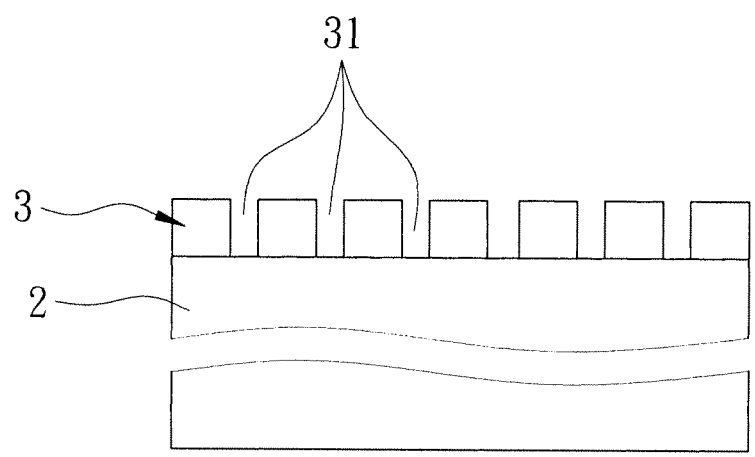
FIG. 8 is a schematic diagram illustrating a step of patterning a sacrificial layer in the second preferred embodiment of a method for making an epitaxial structure according to the present invention.

FIG. 8 illustrates the second preferred embodiment of a method for making an epitaxial structure according to this invention. The second preferred embodiment differs from the first preferred embodiment in that the sacrificial layer 3 is patterned to have a plurality of grooves 31. Because the epitaxial layer unit 4 will not be fully filled into the grooves 31, the temporary substrate 2 can be removed more efficiently due to multiple flow paths of the etchant. The sacrificial layer 3 with grooves 31 can then be etched faster than that without grooves.

Figure 9:
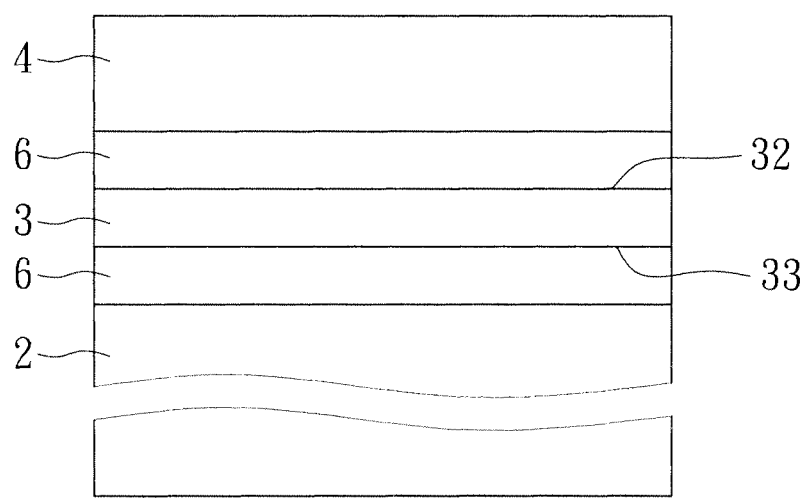
FIG. 9 is a schematic diagram illustrating a step of forming second sacrificial layers in the third preferred embodiment of a method for making an epitaxial structure according to the present invention.

FIG. 9 illustrates the third preferred embodiment of a method for making an epitaxial structure according to this invention. The third preferred embodiment differs from the first preferred embodiment in that the method of the third preferred embodiment further comprises a step of forming two second sacrificial layers 6 on upper and lower surfaces 32, 33 of the sacrificial layer 3. Each of the second sacrificial layers 6 is independently made of a nitrogen-containing material or a silicon-containing material, and has a thickness greater than 0.001 micron. The nitrogen-containing material may be a nitride having an atomic percentage of nitrogen greater than 20%, such as gallium nitrogen, indium gallium nitride, etc. The silicon-containing material may be a silicide having an atomic percentage of silicon greater than 30%, such as silicon film, silicon nitride, etc.

After removing the temporary substrate 2 from the epitaxial layer unit 4 by etching the sacrificial layer 3, the second sacrificial layers 6 are removed. The etchant for the sacrificial layer 3 shows a very low etch rate for the second sacrificial layers 6. After separating the temporary substrate 2 and the epitaxial layer unit 4, the two second sacrificial layers 6 can be easily etched out by using another etchant, especially KOH. The two second sacrificial layers 6 can protect the surfaces of the temporary substrate 2 and the epitaxial layer unit 4 during the long etching process of the sacrificial layer 3.

In other preferred embodiments, the second sacrificial layer 6 can merely be formed on one of the upper and lower surfaces 32, 33 of the sacrificial layer 3.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. An epitaxial structure, comprising:
    a temporary substrate;
    a first sacrificial layer formed on said temporary substrate, and made of gallium oxide; and
    an epitaxial layer unit epitaxially grown over an upper surface of said first sacrificial layer opposite to said temporary substrate;
    wherein said epitaxial structure further comprises a second sacrificial layer disposed on one of said upper surface and a lower surface of said first sacrificial layer such that said epitaxial layer unit is epitaxially grown over said first and second sacrificial layers; and
    wherein said second sacrificial layer is made of a material selected from a nitride that has an atomic percentage of nitrogen greater than 20%, and a silicide that has an atomic percentage of silicon greater than 30%.

2. The epitaxial structure of claim 1, wherein said first sacrificial layer is patterned to have a plurality of grooves.

3. The epitaxial structure of claim 1, wherein said first sacrificial layer is made of $Ga_2O_3$.

* * * * *